(12) United States Patent
Neeb

(10) Patent No.: US 6,894,523 B2
(45) Date of Patent: May 17, 2005

(54) SYSTEM AND METHOD FOR TESTING SEMICONDUCTOR DEVICES

(75) Inventor: Jim Neeb, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/612,553

(22) Filed: Jul. 1, 2003

(65) Prior Publication Data

US 2005/0001647 A1 Jan. 6, 2005

(51) Int. Cl.⁷ .............................................. G01R 31/26
(52) U.S. Cl. .................................... 324/765; 324/158.1
(58) Field of Search ................................ 324/754–758, 324/761–762, 765, 158.1

(56) References Cited

U.S. PATENT DOCUMENTS

| | | | |
|---|---|---|---|
| 5,821,764 A | * 10/1998 | Slocum et al. .............. | 324/758 |
| 6,064,215 A | * 5/2000 | Kister ........................ | 324/754 |
| 6,166,553 A | * 12/2000 | Sinsheimer ................. | 324/754 |
| 6,292,005 B1 | * 9/2001 | Suga .......................... | 324/754 |
| 6,420,885 B1 | * 7/2002 | Fredrickson ................ | 324/754 |

* cited by examiner

Primary Examiner—Minh N. Tang
(74) Attorney, Agent, or Firm—Marger Johnson & McCollom

(57) ABSTRACT

The invention(s) relates to semiconductor test system and method that isolates and counteracts forces that bend test equipment resulting in improved manufacturing yield and throughput. The system includes a force retainer fixedly mounted on a material handler and a force locator positioned between the force retainer and a circuit board. Together, the force retainer and locator prevent the circuit board from bending. Other embodiments are illustrated and described.

18 Claims, 4 Drawing Sheets

US 6,894,523 B2

SYSTEM AND METHOD FOR TESTING SEMICONDUCTOR DEVICES

BACKGROUND OF THE INVENTION(S)

1. Field of the Invention(s)

The invention(s) relates to a semiconductor test system and method. More particularly, the invention(s) relates to a semiconductor test system and method that isolates and counteracts forces that bend test equipment resulting in improved manufacturing yield and throughput.

2. Description of the Related Art

Semiconductor devices, e.g., wafers and integrated circuits, are typically tested at various points in their manufacture. Testing ensures the devices—and the manufacturing processes used to produce them—are working properly and within acceptable quality ranges.

A typical test is as follows. The wafer or integrated circuit under test (DUT) is placed on a chuck or similar mechanical tool that brings the DUT into contact with the test system. The DUT electrically connects to the test equipment through contact pins, often spring-loaded. The aggregate force of the spring-loaded pins is high, often exceeding 100 pounds. This aggregate force might cause the test equipment to flex or bow, damaging the test equipment and the DUT and causing inconsistent electrical contact between them. Inconsistent electrical contact increases test failures, lowering yield and throughput.

Accordingly, a need remains for semiconductor test system and method that reduces test equipment bending resulting in improved yield and throughput.

BRIEF DESCRIPTION OF THE DRAWINGS

The foregoing and other objects, features, and advantages of the invention(s) will become more readily apparent from the detailed description of an embodiment that references the following drawings.

DETAILED DESCRIPTION OF THE PREFERRED EMBODIMENT

Figure 1:
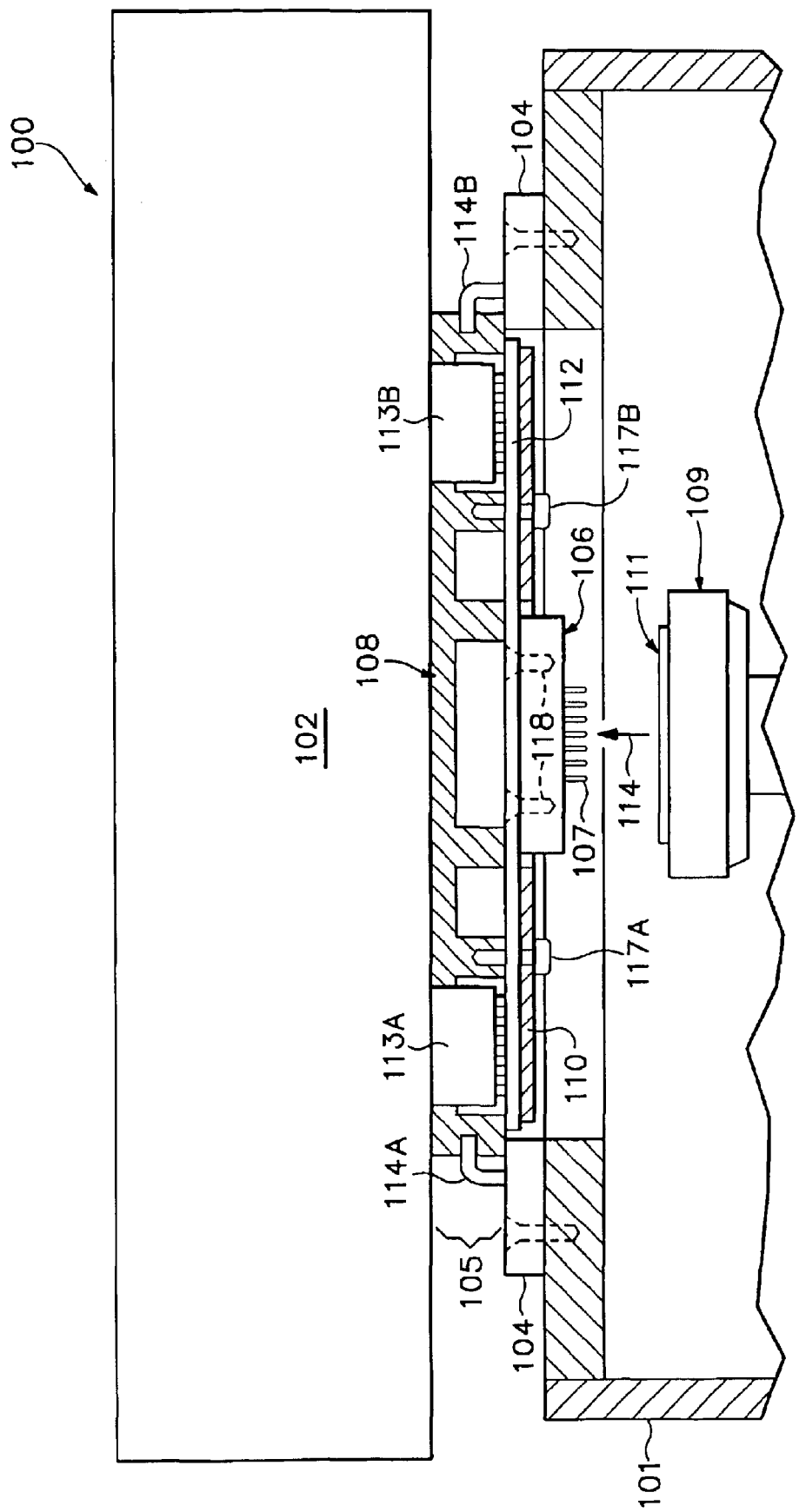
FIG. 1 is a side view of a conventional test system.

FIG. 1 is a side view of a conventional test system 100. Referring to FIG. 1, a test system 100 includes an interface unit 105 mounted on a top plate 104 of a material handler 101. A person of reasonable skill in the art should recognize that the material handler 101 is known by various names depending on the type of the DUT. For example, the material handler 101 is a prober where the DUT is a wafer or a part handler where the DUT is a packaged integrated circuit. The top plate 104 might have a variety of different shapes and sizes and be made of different materials depending on the application.

The interface unit 105 is mounted on the top plate 104 using a variety of fasteners, e.g., clamps 114A and 114B. A person of reasonable skill in the art should recognize other fasteners used for mounting the interface unit 105 to the top plate 104, including screws, clips, hinges, tacks, nails, and the like. The interface unit 105 interfaces the DUT 111, e.g., a wafer, to the test head 102. A person of reasonable skill in the art should recognize that the interface unit 105 is known by various names depending on the type of DUT. For example, the interface unit 105 is a sort interface unit (SIU) where the DUT is a wafer and a test interface unit (TIU) where the DUT is a packaged integrated circuit.

The interface unit 105 is unique to each DUT model under test. For example, one interface unit tests wafers having one design and another interface unit tests wafers having another design. Thus, the interface unit 105 changes at least every time the DUT model being tested changes. And the interface unit 105 might be replaced if it fails or otherwise stops functioning properly within a single DUT production run.

The interface unit 105 includes a probe head 106 mounted on a printed circuit board (PCB) 112. The probe head 106 is alternatively termed a socket or contactor in packaged test. The probe head 106 is mounted on the PCB 112 using a variety of fasteners, e.g., screws 118. A person of reasonable skill in the art should recognize other fasteners capable of use in mounting the probe head 106 to the PCB 112, including clamps, clips, hinges, tacks, nails, and the like. Contact pins 107 extend outwardly from the probe head 106. The contact pins 107 might be spring loaded.

The PCB 112 includes electronics used to interface the test head 102 to the DUT 111 such that test head 102 is capable of loading, stressing, and otherwise testing the DUT 111. The PCB 112 includes traces, power planes, and a variety of components, e.g., relays, integrated circuits, capacitors, resistors, and the like. The PCB 112 might have any of a variety of shapes and come in any of a variety of sizes depending on the particular interface unit 105 and DUT 111. The PCB 112 is made of a variety of well-known materials including fiberglass FR4 and the like.

The test head 102 includes electronics used to test the DUT 111. The test head 102 simulates a variety of load and other stress conditions designed to identify faulty or marginally operative DUTs 111. The test head 102 includes connectors 113A and 113B. The connectors 113A and 113B are connected to the test head 102 at one end and to the PCB 112 at another end. A person of reasonable skill in the art knows well the design of the probe head 106, PCB 112, and test head 102, and, thus, we will not discuss them in any further detail.

The test system 100 operates as follows. Before testing begins, the interface unit 105 is mounted on the top plate 104 using clamps 114A and 114B. The connectors 113A and 113B on the test head 102 are connected to the PCB 112. A chuck or other material handling equipment 109 brings the DUT 111 into contact with the probe head 106 and, more particularly, the contact pins 107. The contact pins 107 electrically connect the DUT 111 to the PCB 112 to the test head 102. As the chuck 109 pushes the DUT 111 into the contact pins 107, it exerts a probe force 114 on the interface unit 105 and the test head 102. The probe force 114 can exceed 100 pounds for high pin count packaged integrated circuits.

If left unchecked, the probe force 114 might cause the interface unit 105 and the probe head 102 to bend, flex, or bow resulting in damage to the system 100 and/or the DUT 111. In particular, the probe force 114 might cause the probe head 106 and PCB 112 to bend resulting in intermittent electrical contact between them and the DUT 111, which, in turn, results in lowering yield and throughput.

The probe force 114 must be counteracted to prevent it from bending the test system 100. In one embodiment, the interface unit 105 includes a stiffener plate 110 fixedly mounted on the underside of the PCB 112. The stiffener plate 110 is mounted on the PCB 112 using a variety of fasteners, e.g., screws 117A and 117B. A person of reasonable skill in the art should recognize other fasteners capable of use in mounting the stiffener plate 110 to the PCB 112, including clamps, clips, hinges, tacks, nails, and the like. The stiffener plate 110 might have a variety of shapes and sizes depending on the interface unit 105 (and, more particularly the PCB 112). In one embodiment, the stiffener plate 110 surrounds the probe head 106. The stiffener plate 110 might be made of a variety of materials. In one embodiment, the stiffener plate 110 is stainless steel allowing the stiffener plate 110 to be both thin and strong.

In one embodiment, the interface unit 105 includes a stiffener ring 108 mounted on the topside of the PCB 112 using a variety of fasteners, e.g., screws 117A and 117B. A person of reasonable skill in the art should recognize other fasteners capable of use in mounting the stiffener ring 108 to the PCB 112, including clamps, clips, hinges, tacks, nails, and the like. The stiffener ring 108 is positioned between the test head 102 and the PCB 112. The stiffener ring 108 might have a variety of shapes and sizes. In one embodiment, the stiffener ring 108 includes a plurality of concentric rings interconnected with support members (not shown). The connectors 113A and 113B access the PCB 112 through open spaces between the support members. The inner most concentric ring supports the center of the PCB 112. The stiffener ring 108 might be made of a variety of materials. In one embodiment, the stiffener ring 108 is aluminum.

The stiffener plate 110 and the stiffener ring 108 prevent the probe force 114 from bending the interface unit 105 and, more particularly, the PCB 112. The interface unit 105 must be light since operators often replace it. It follows that the stiffener plate 110 and the stiffener ring 108 must also be light. And the stiffener ring 108 is height constrained by the connectors 113A and 113B and the position of the test head 102.

The addition of the stiffener plate 110 and the stiffener ring 108 increases the cost of the interface unit 105 since each interface unit 105 is a consumable that includes these additional components. And the stiffener plate 110 and the stiffener ring 108 only partially prevent bending of the interface unit 105 because of their designs' weight and height constraints that result in stiffness limits.

Finally, simulation and testing of the system 100 is difficult. This is because the test head 102 and the interface unit 105 form an integral part of the system 100. Simulation is made difficult because different manufacturers design and develop the different components of the system 100, e.g., the interface unit 105 and the test head 102. Getting modeling data from each of these manufacturers is at best cumbersome. Testing does not reasonably approximate the system 100's true performance without the test head 102. But with the test head 102 in place, data collection equipment cannot be properly attached to the system 100 to measure the system 100's bend.

Figure 2:
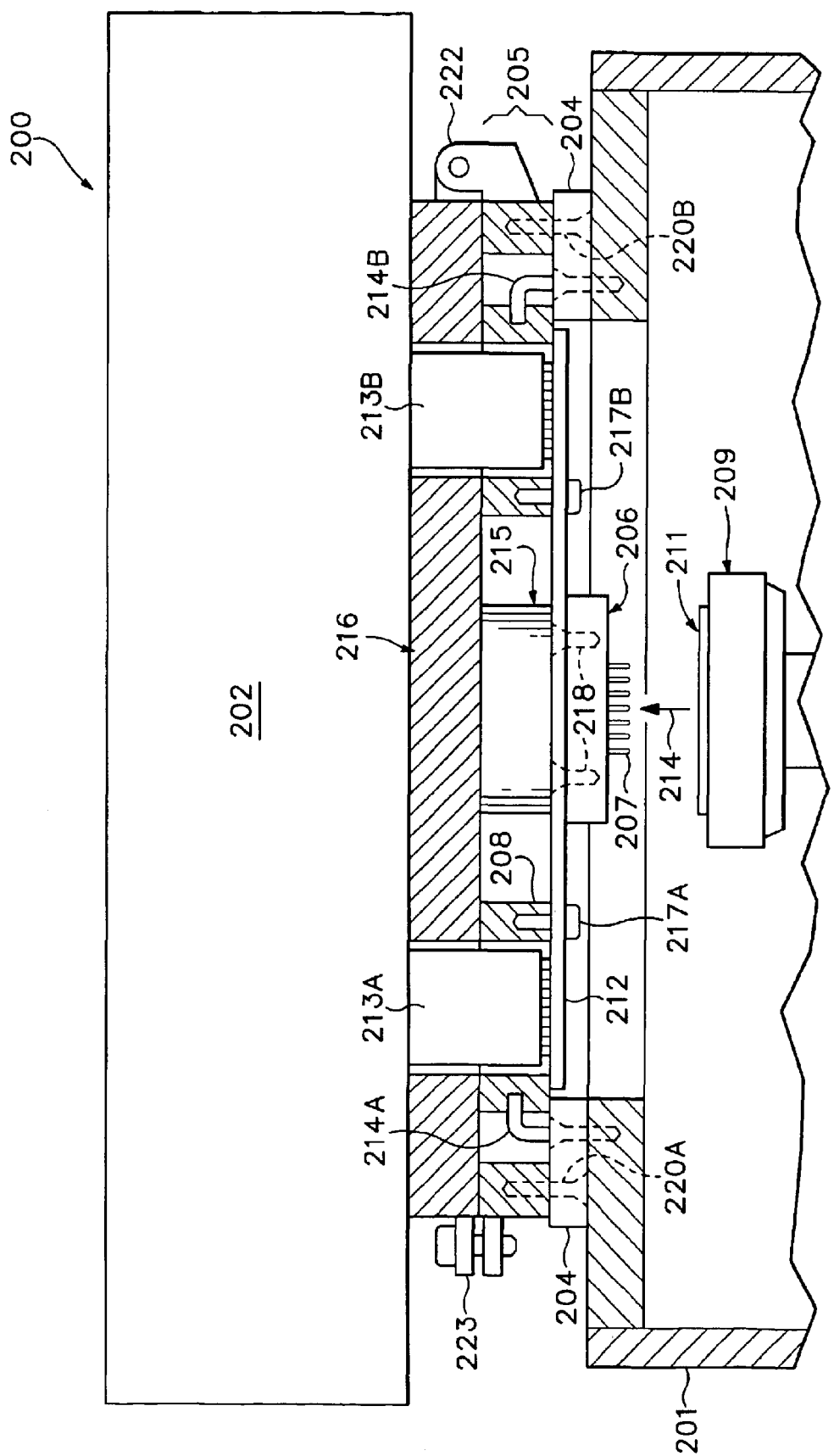
FIG. 2 is a side view of a test system.

The system 200 addresses these and other disadvantages. Referring to FIG. 2, a test system 200 includes an interface unit 205 mounted on a top plate 204 of a material handler 201. In one embodiment, the interface unit 205 might be mounted on the top plate 204 using a variety of fasteners, e.g., clamps 214A and 214B. In another embodiment, the interface unit 205 might be mounted on the force retainer 216 using a variety of fasteners, e.g., screws. A person of reasonable skill in the art should recognize other fasteners capable of use in mounting the interface unit 205 to the top plate 204 (or the force retainer 216), including screws, clips, hinges, tacks, nails, and the like. The top plate 204 might have a variety of different shapes and sizes and be made of different materials depending on the application.

Like the interface unit 105, the interface unit 205 is unique to each DUT model under test. For example, one interface unit 205 tests wafers having one design and another interface unit 205 tests wafers having another design. The interface unit 205, therefore, changes at least every time the DUT model being tested changes. And the interface unit 205 might be replaced if it fails or otherwise stops functioning properly within a single DUT production run.

The interface unit 205 includes a probe head 206 mounted on a PCB 212 on a first end. The probe head 206 is mounted on the PCB 212 using a variety of fasteners, e.g., screws 218. A person of reasonable skill in the art should recognize other fasteners capable of use in mounting the probe head 206 to the PCB 212, including clamps, clips, hinges, tacks, nails, and the like. Contact pins 207 extend outwardly from the probe head 206. As with contact pins 107, the contact pins 207 might be spring-loaded.

The PCB 212 includes electronics used to interface the test head 202 to the DUT 211 such that test head 202 is capable of loading, stressing, and otherwise testing the DUT 211. The PCB 212 includes traces, power planes, and a variety of components, e.g., relays, integrated circuits, capacitors, resistors, and the like. The PCB 212 might have any of a variety of shapes and come in any of a variety of sizes depending on the particular interface.

Like the test head 102, the test head 202 includes electronics used to test the DUT 211. The test head 202 simulates a variety of load and other stress conditions designed to identify faulty or marginally operative DUTs 211. The test head 202 includes connectors 213A and 213B. The connectors 213A and 213B are connected to the test head 202 at one end and to the PCB 212 at another end. A person of reasonable skill in the art knows well the design of the probe head 206, PCB 212, and test head 202, and, thus, we will not discuss them in any further detail.

The interface unit 205 includes a stiffener ring 208. The stiffener ring 208 is mounted on the topside of the PCB 212 using a variety of fasteners, e.g., screws 217A and 217B. A person of reasonable skill in the art should recognize other fasteners capable of use in mounting the stiffener ring 208 to the PCB 212, including clamps, clips, hinges, tacks, nails, and the like.

Figure 3:
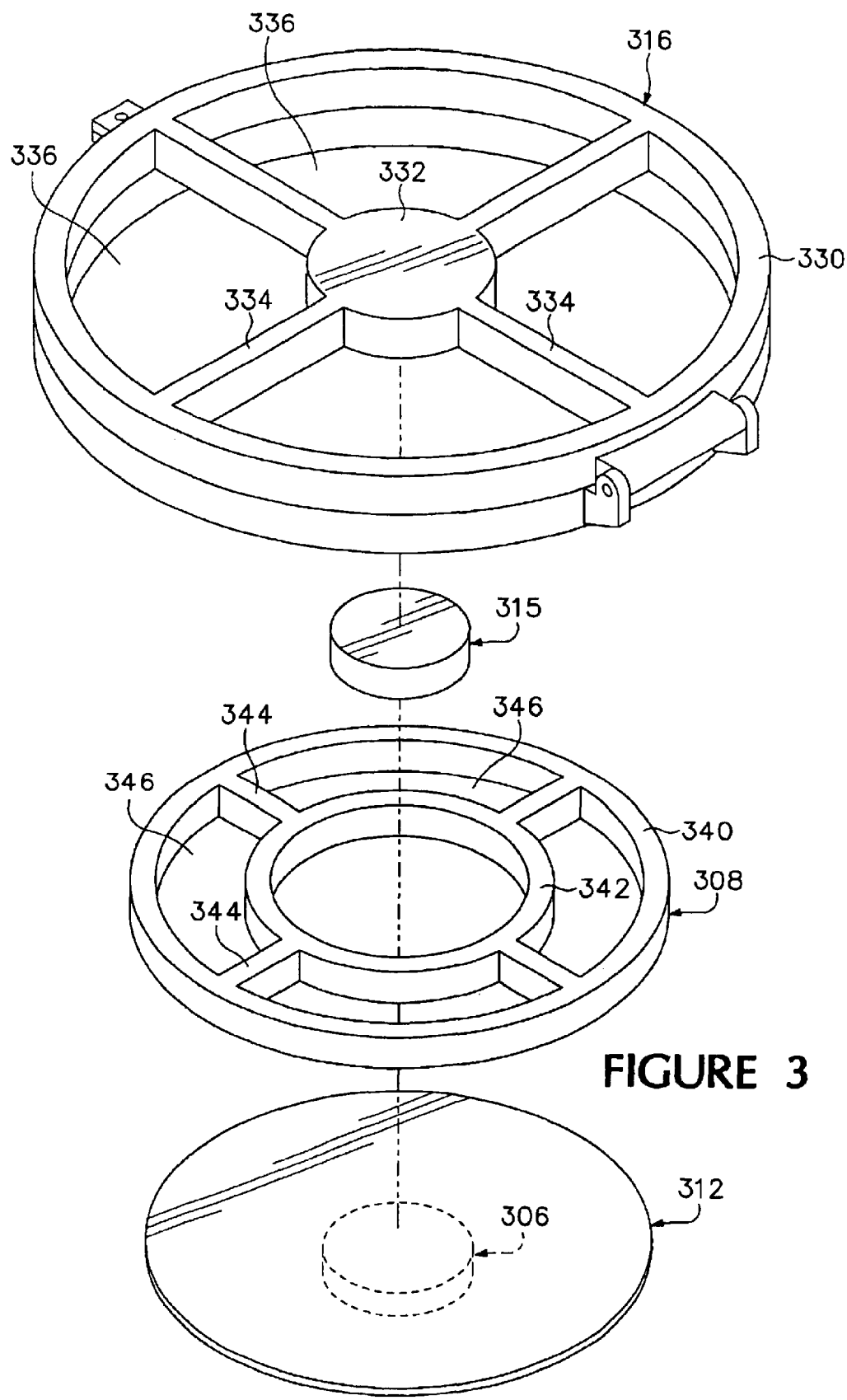
FIG. 3 is an exploded view of a test system.

The stiffener ring 208 might have a variety of shapes and sizes depending on the particular application. Referring to FIGS. 2 and 3, in one embodiment, the stiffener ring 308 includes an outer ring 340 surrounding an inner ring 342. A plurality of ribs 344 connects the outer ring 340 to the inner 342. Adjacent ribs 344 leave a space 346 through which connectors, e.g., connectors 213A and 213B, access the PCB 312 from the test head 202. The stiffener ring 208 is adapted to stiffen the PCB 212 particularly in the area of the connectors 213A and 213B.

The interface unit 205 includes a force locator 215 fixedly mounted on the PCB 212 with fasteners, e.g., screws 218. A person of reasonable skill in the art should recognize other fasteners capable of use in mounting the force locator to the PCB 212, including clamps, clips, hinges, tacks, nails, and the like. The force locator 215 might have a variety of shapes and sizes depending on the application. Referring to FIGS. 2 and 3, in one embodiment, the force locator 315 might have a shape similar to that of the probe head 306. In another embodiment, the force locator 315 might have cutouts (not shown) to allow for component clearance on the PCB 212. The force locator 215 might be adjusted to accommodate any spacing limitations imposed by the connectors 213A and 213B by, e.g., milling or removing extraneous material. The force locator 215 is made of light, inexpensive materials. In one embodiment, the force locator 215 might be made of plastic. In another embodiment, the force locator 215 might be part of a metal plate (not shown) included on the topside of the PCB 212 and used for planarity adjustments. In this later case, the force locator 215 might made of a light metal such as aluminum.

The force locator 215 provides mechanical contact between a force retainer 216 and the PCB 212 to thereby create a compressive counter force to the probe force 214. Put differently, the force locator 215 provides support directly behind the probing force 214 directing it from the PCB 212 to the force retainer 216.

The system 200 includes the force retainer 216 fixedly mounted on the top plate 204. The force retainer 216 is mounted on the top plate with a variety of fasteners, e.g., screws 220A and 220B. In the embodiment shown in FIG. 2, the force retainer 216 is hinged at one end with hinge 222 and latched at another end with latch 223. The force retainer 216 might be hinged depending on how and in what sequence the interface unit 205 is mounted on the material handler 201. The force retainer 216 might also be hinged depending on how and in what sequence the test head 202 is brought into contact with the interface unit 205.

The force retainer 216 might have a variety of shapes and sizes depending on the application, including those shown in FIG. 3. The last two digits of the reference designators shown in FIGS. 2 and 3 refer to similar structure. Referring to FIGS. 2 and 3, in one embodiment, the force retainer 316 might have a web-like structure where an outer ring 330 surrounds an inner plate 332. The outer ring 330 and inner plate 332 are connected by a plurality of ribs 334. Adjacent ribs 334 leave an opening or space 336 through which a connector, e.g., connector 213A, accesses the PCB 312 from the test head 202.

Since the force retainer 216 is fixedly mounted on the top plate 204 and an integral part of the material handler 201 (and not part of the interface unit 205) it is not subject to the weight and height limitations imposed on the stiffener ring 108. The force retainer 216, therefore, might be made of heavier and stiffer, materials, e.g., steel or cast iron.

Since the force retainer 216 is not part of the interface unit 205, but rather fixedly mounted on the material handler 201, the cost of the interface unit 205 decreases because it no longer integrates stiffening hardware (e.g., stiffener plate 110). Relative to the embodiment shown in FIG. 1, the system 200 eliminates the stiffener plate 110 and simplifies the stiffener ring 108. And the test interface unit 205's weight is lower improving its handling capability. Bending on the system 200 is not impacted by the test head 202 allowing easier characterization without the test head 202 in place. That is, data collection equipment can be attached to the system 200. And since the force retainer 216 is fixedly mounted on the test handler 201 and counteracts the probing force 214, the contribution of the test head 102 to the system's 200 rigidity is negligible. For modeling and testing purposes, therefore, it is not required or needed. Once the force retainer 216 is simulated and modeled, there is no need to retest with new test interface units 205.

Figure 4:
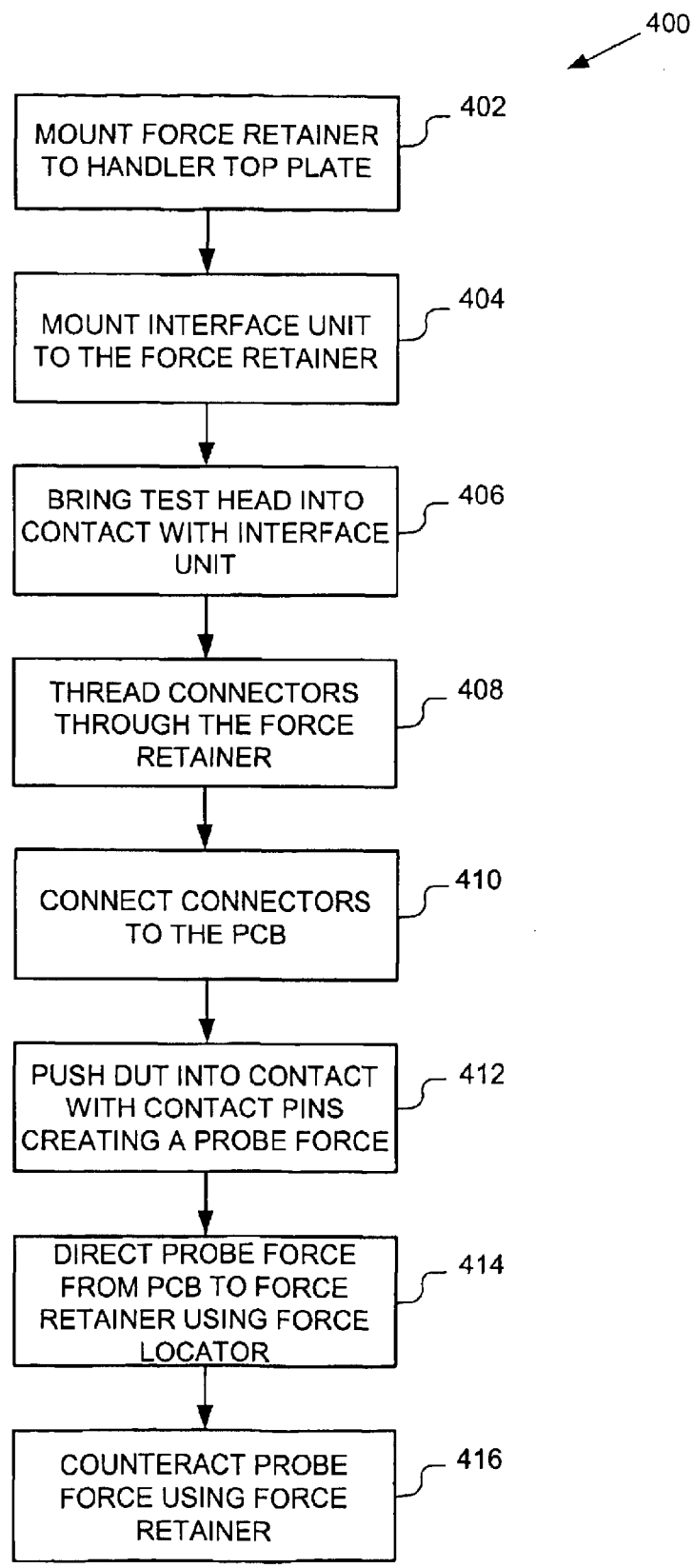
FIG. 4 is a flowchart of a test method.

FIG. 4 is a flowchart of a method 400 exemplifying an operation of test system 200. A person of reasonable skill in the art understands that it can modify the invention(s) by exchanging, adding, removing, re-ordering, or otherwise changing the boxes described in FIG. 4 without departing from the scope and spirit of the present invention(s).

Referring to FIG. 4, at 402, a force retainer is fixedly mounted directly to a top plate of a material handler using any of a variety of fasteners, e.g., screws. At 404, an interface unit is mounted on the force retainer from one side (e.g., bottom). At 406, a test head is brought into proximity with the material handler and the interface unit. Connectors on the test unit are threaded through the force retainer and stiffener ring and connected to the PCB (408 and 410). At 412, a chuck or other material handling equipment moves the DUT into contact with the probe head and, more particularly, the contact pins. As the chuck pushes the DUT into the contact pins, it exerts a probe force on the system. At 414, a force locator directs the probe force from the interface unit to the force retainer. At 416, the force retainer retains or counteracts the probe force avoids bending the interface unit (and its PCB) and the test head. By doing so, the force retainer prevents intermittent contact between the contact pins and the DUT thereby improving yield and throughput.

Having illustrated and described the principles of our invention(s), it should be readily apparent to those skilled in the art that the invention(s) can be modified in arrangement and detail without departing from such principles. We claim all modifications coming within the spirit and scope of the accompanying claims.

I claim:

1. A system for testing semiconductor devices, comprising:
   a force retainer mounted on a material handler; and
   a force locator interposed between the force retainer and a circuit board and, together with the force retainer, adapted to prevent the circuit board from bending; and
   a stiffener ring mounted on the circuit board and surrounding the force locator.

2. The system of claim 1 where the force retainer comprises:
   outer and inner rings; and
   a plurality of ribs connecting the outer ring to the inner ring.

3. The system of claim 1 comprising
   a test head including a plurality of connectors connecting the test head to the circuit board;
   where the force retainer includes a plurality of openings between adjacent radial ribs; and
   where the plurality of connectors protrude through the plurality of openings.

4. The system of claim 1 where the force retainer is steel.

5. The system of claim 1 where the force retainer is cast iron.

6. The system of claim 1 where the force locator is mounted on the circuit board.

7. The system of claim 1 where the force locator has a same shape as a probe head.

8. The system of claim 1 where the force locator is adjustable to accommodate spacing limitations between the circuit board and the force retainer.

9. A tester comprising:
   a top plate on a material handler;
   a force retainer fixedly mounted on the top plate, the force retainer including an outer ring connected to an inner ring by a plurality of ribs; and
   an interface unit removably mounted on the force retainer and including a force locator, the force locator being fixedly mounted on a circuit board, the interface unit including a circuit board stiffener ring mounted on the circuit board and surrounding the force locator.

10. The tester of claim 9 where the interface unit comprises a probe head attached to the circuit board on one side and having contact pins protruding from another side.

11. The tester of claim 9 where the force locator is a same shape as the probe head.

12. The tester of claim 9 comprising a test head adapted to provide electrical signals to a device under test through at least one connector, the at least one connector protruding from at least one open portion between adjacent ribs.

13. A method of testing semiconductor devices, comprising;

fixedly mounting a force retainer to a material handler;

removably mounting an interface unit to the force retainer;

mounting a force locator the interface unit; and surrounding the force locator with a stiffener ring.

14. The method of claim 13 comprising mounting the stiffener ring to a circuit board.

15. The method of claim 14 comprising distributing a probe force on the force retainer using the force locator.

16. The method of claim 13 comprising providing the force retainer with inner and outer rings; and connecting the outer ring to the inner ring using at least one radial rib.

17. The method of claim 13 comprising:

positioning a test head on one side of the handler;

providing the test head with at least one connector; and threading the connector through the force retainer.

18. The method of claim 13 comprising:

bringing a device under test into contact with the interface unit thereby creating a probe force;

directing the probe force from the interface unit to the force retainer; and retaining the probe force using the force retainer.

* * * * *